US010416216B2

(12) United States Patent
Rogge et al.

(10) Patent No.: US 10,416,216 B2
(45) Date of Patent: Sep. 17, 2019

(54) OPTICAL ADDRESSING OF INDIVIDUAL TARGETS IN SOLIDS

(71) Applicants: NewSouth Innovations Pty Limited, New South Wales (AU); Australian National University, ACT (AU); University of Melbourne, Parkville (AU)

(72) Inventors: Sven Rogge, Sydney (AU); Matthew John Sellars, Sydney (AU); Chunming Yin, Sydney (AU); Jeffrey Colin McCallum, Sydney (AU); Gabriele Gaetano De Boo, Sydney (AU); Milos Rancic, Sydney (AU); Nikolas Stavrias, Sydney (AU)

(73) Assignees: Australian National University, Sydney (AU); University of Melbourne; Newsouth Innovations Pty Limited

( * ) Notice: Subject to any disclaimer, the term of this patent is extended or adjusted under 35 U.S.C. 154(b) by 837 days.

(21) Appl. No.: 14/651,294

(22) PCT Filed: Dec. 11, 2013

(86) PCT No.: PCT/AU2013/001449
§ 371 (c)(1),
(2) Date: Jun. 11, 2015

(87) PCT Pub. No.: WO2014/089621
PCT Pub. Date: Jun. 19, 2014

(65) Prior Publication Data
US 2015/0316598 A1 Nov. 5, 2015

(30) Foreign Application Priority Data
Dec. 11, 2012 (AU) .............................. 2012905400

(51) Int. Cl.
*B82Y 10/00* (2011.01)
*G01R 29/24* (2006.01)
*G06N 10/00* (2019.01)

(52) U.S. Cl.
CPC .............. *G01R 29/24* (2013.01); *B82Y 10/00* (2013.01); *G06N 10/00* (2019.01)

(58) Field of Classification Search
CPC .. G01R 33/20–26; G01R 33/60; G01R 29/24; G01C 19/58–62; G01N 24/00–10; B82Y 10/00
(Continued)

(56) References Cited

U.S. PATENT DOCUMENTS

2007/0263676 A1* 11/2007 Beukema ............ H01S 3/09415
372/6
2009/0146222 A1* 6/2009 Agrawal ................ B82Y 10/00
257/401
(Continued)

FOREIGN PATENT DOCUMENTS

WO 2009100483 A1 8/2009

OTHER PUBLICATIONS

Gregorkiewicz; "Direct spectral probing of energy storage in Si: Er by a free-electron laser"; Pub. Date Dec. 1999; Applied Physics Letters; vol. 75, No. 26; p. 4121-4123.*
(Continued)

*Primary Examiner* — Melissa J Koval
*Assistant Examiner* — Rahul Maini
(74) *Attorney, Agent, or Firm* — Wood, Phillips, Katz, Clark & Mortimer

(57) ABSTRACT

This disclosure concerns photonics and in particular the addressing of individual targets in solids. In aspect one there is provided a device comprising a solid substrate with one or more atomic scale targets in the substrate. A laser light is
(Continued)

focused on a region of the substrate that contains a single target to selectively cause photoionization of the target. A charge sensor with sub-electron charge sensitivity is focussed on measuring the charge in the region of the substrate that contains a single target. In use, the device operates such that the laser is turned on to cause photoionization of the target, and the charge sensor detects the change in charge in the region of the substrate that contains the single target. In another aspect is the method for optically investigating individual nuclear spin states of single atoms by investigating both the Zeeman effect and the hyperfine interaction of the single atoms.

11 Claims, 4 Drawing Sheets

(58) Field of Classification Search
USPC .................................................. 324/300–322
See application file for complete search history.

(56) References Cited

U.S. PATENT DOCUMENTS

2010/0323917 A1* 12/2010 Vertes ................. H01J 49/0418
506/12
2011/0121895 A1* 5/2011 Morello ................. B82Y 10/00
327/581

OTHER PUBLICATIONS

Gonthiez et al.; VUV laser photoionization of laser-stimulated desorbed species; Pub Date Dec. 28, 1999; Applied Physics A; vol. 69 [Suppl.]; p. S171-S173.*
Moraru et al.; Atom devices based on single dopants in silicon nanostructures; Pub. Date Jul. 29, 2011; Nanoscale Research Letters; 2011 6:479; p. 1-9.*
Thewalt et al. (Direct observation of the donor nuclear spin in a near-gap bound exciton transition: 31P in highly enriched 28Si*; Pub. Date Apr. 27, 2007; Journal of Applied Physics; vol. 101, 081724; p. 1-5).*
Thompson et al.; "Integrated waveguide circuits for optical quantum computing"; 2011; IET Circuits, Devices & Systems; vol. 5, Iss. 2; p. 94-102 (Year: 2011).*

Blatt et al. Entangled states of trapped atomic Ions.
Ritter et al. An elementary quantum network of single atoms in optical cavities.
Hofmann et al. Heralded entanglement between widely separated atoms.
Stute et al. Tunable ion-photon entanglement in an optical cavity.
Togan et al. Laser cooling and real-time measurement of the nuclear spin environment of a solid-state qubit.
Togan et al. Quantum entanglement between an optical photon and a solid-state spin qubit.
Morton et al. Embracing the quantum limit in silicon computing.
Ladd et al. Quantum computers.
O'Brien et al. Photonic quantum technologies.
Gisin et al. Quantum communication.
Fuechsle et al. A single-atom transistor.
Pla et al. A single-atom electron spin qubit in silicon.
Tyryshkin et al. Electron spin coherence exceeding seconds in high-purity silicon.
Steger et al. Information Storage for over 180 s Using Donor Spins in a 28Si "Semiconductor Vacuum".
Zwanenburg et al. Silicon quantum electronics.
Kenyon, A.J. Erbium in silicon.
Vinh et al. Photonic properties of er-doped crystalline silicon.
Kolesov et al. Optical detection of a single rare-earth ion in a crystal.
Hanson et al. Spins in few-electron quantum dots.
Guillot-Noël et al. Hyperfine interaction of Er3+ ions in Y2SiO5: an electron paramagnetic resonance spectroscopy study.
Hedges et al. Efficient quantum memory for light.
Smith et al. The hyperfine structure of 167Er and magnetic moments of 143, 145Nd and 167Er by atomic beam triple magnetic resonance.
McAuslan et al. Reducing decoherence in optical and spin transitions in rare-earth-metal-ion-doped materials.
Yang et al. Electron paramagnetic resonance of Er3+ ions in aluminum nitride.
Bertaina et al. Rare-earth solid-state qubits.
Vinh et al. Optical properties of a single type of optically active center in Si/Si:Er nanostructures.
Vincent et al. Electronic read-out of a single nuclear spin using a molecular spin transistor.
Lansbergen et al. Gate-induced quantum-confinement transition of a single dopant atom in a siliconFinFET.

* cited by examiner

OPTICAL ADDRESSING OF INDIVIDUAL TARGETS IN SOLIDS

CROSS-REFERENCE TO RELATED APPLICATIONS

The present application claims priority from Australian Provisional Patent Application No 2012905400 filed on 11 Dec. 2012, the content of which is incorporated herein by reference.

TECHNICAL FIELD

This disclosure concerns photonics and in particular the optical addressing of individual targets in solids. The phrase 'optical addressing' refers to the use of light, in particular laser light, to stimulate the change of state of the target. The purpose is generally to detect this change of state to determine the prior state of the target or to modify the final state of the target, or both.

BACKGROUND ART

The conventional approach to detecting the state of optical excitation of targets, where the target is an atom, ion or centre in a solid, involves laser irradiation to promote an electron to a higher energy level. When the electron returns to its original energy level a single photon is emitted, and detection of that single photon is attempted. The efficiency of the detection process depends on several factors:
- the quantum efficiency of the emission, that is the probability of the target emitting a detectable photon.
- the collection efficiency, that is the probability of the detectable photon arriving at the detector, and
- the detector efficiency, that is the probability of the detector detecting the photon.

Since the overall probability is generally low it is necessary to repeat the measurement many times in order to determine whether the target is being excited by the light.

Single charge detection with electrical control is known using single-electron transistors.

SUMMARY

This disclosure concerns a device comprising:
a solid substrate;
one or more atomic scale targets in the substrate;
a laser light focussed on a region of the substrate that contains a single target to selectively cause photoionization of the single target;
a charge sensor with sub-electron charge sensitivity focussed on measuring the charge in the region of the substrate that contains the single target;
wherein, in use, the device operates such that the laser light is turned on to cause photoionization of the single target, and the charge sensor detects the change in charge in the region of the substrate that contains the single target.

The solid substrate may comprise silicon (Si) or other group III/V and group II/VI semiconductors, and dielectric crystals, such as Yttrium-Aluminium-Granat (YAG).

The targets may comprise shallow dopants such as Phosphorus (P), Arsenic (As), Antimony (Sb), Bismuth (Bi), Boron (B), Indium (In) and Aluminium (Al), optically active sites such as rare earth ions, or other suitable dopants.

The laser light may be generated from any laser having suitable wavelength(s). The laser light may be delivered to the single target via optical fibres that guide the laser light onto the target, or via laser waveguides into which the device is placed. This allows the light to be guided on-chip instead of the optical fibre. Light will be coupled into the chip at its edge.

Photoionization may occur via several processes, including any one or more of:
direct photoionization based on a single photon (resonant or not);
a two photon process;
a two photon process where at least one of the transitions is resonant; or
a resonant excitonic transition that forms a metastable state which decays and leaves the site ionized.

The third and fourth ionization processes listed above, involve resonant transitions and allow for high spectral resolution that give access to information about the electron orbital and spin state as well as the nuclear spin state.

The charge sensor typically comprises the gate of a silicon-on-insulator Single Electron Transistor (SET) or a dielectrics metal SET so that very small changes of the charge in or near the gate will result in much greater current flows through the conduction path of the transistor.

This technique for the detection of optical excitation in solids offers a much higher fidelity and efficiency than previously available techniques. The technique can be utilized to achieve a single-shot readout of the optical excitation of a single solid-state centre. Other suitable charge sensor device geometries include a planar nano transistor, an accumulation layer Field-effect transistor (FET), a metal SET on a dielectric, a coulomb blockade island charge sensor, a charge island gate and a waveguide gate.

In the best mode even a single optical excitation event can result in a large electronic signal consisting of many electrons, for instance $1 \times 10^7$ electrons. The efficiency of the excitation to a level within the bandgap depends only on the efficiency of the excitation into the conduction band. The efficiency of this process can be increased to close to 100%, by increasing the intensity of the light used to drive this final ionization step. This technique is important to quantum computation and communications since photons play an important role in initialisation, manipulation, and detection of the quantum states in qubit systems which have been shown to enjoy high fidelity and long coherence times [1-6].

A particular implementation utilises a Si based SET in form of a Fin-Shaped Field Effect Transistor (FinFET) [28] in which optical centres are embedded. The SET is biased such that a small current flows just below (above) to a charge degeneracy point. The device is illuminated with light from a single mode optical fibre. When the light is resonant with one of the transitions of the optical centres it photoionizes and changes the charge state of the atom which is detected by an increase (decrease) in current in case of a loss of an electron as in the case of Erbium (Er):Si. Laser light with a very narrow linewidth is used to gain high spectroscopic resolution with access to the electron and nuclear state.

This disclosure also concerns a method for optically investigating individual nuclear spin states of single atoms incorporated into a crystalline lattice, comprising the steps of:
performing photoionization spectroscopy at a single-atom;
sensing nano-transistor charge arising from the photoionization spectroscopy at the single-atom;
studying both the Zeeman effect and the hyperfine interaction of the single-atom to determine the state of single atoms and ions incorporated into the crystalline lattice.

Another particular implementation involves the optical addressing of individual Er atoms and individual nuclear spin states of one $^{167}$Er atom in natural silicon may be achieved using photoionization spectroscopy developed to a single-atom level via nano-transistor charge sensing. This enables both the Zeeman effect and the hyperfine interaction to be studied on individual atoms. As a result it is possible to investigate individual atoms and ions incorporated into crystalline semiconductor, as well as optically addressing and manipulating the electron and nuclear spin states of an individual atom or ion in a semiconductor. Charge-sensing photoionization spectroscopy can be applied to dopant atoms incorporated into semiconductors, as well as other disciplines.

Charge detection is based on a FinFET SET to observe the resonant photoionization of single Er ions in Si. Resonant photoionization based on a 15/2 to 13/2 transition is observed with sub 1 ueV resolution. Zeeman splitting is observed as well as the hyperfine splitting of the transition. This leads to optical single-shot readout of the electronic and nuclear spin states of a single dopant atom. Thus, representing the key building block for an optical solid-state quantum interface.

Furthermore, single site ultra-high resolution spectroscopy of Er in Si is a powerful new technique to determine the structure and dynamics of impurities in semiconductors. The achieved result is important for shallow and deep donor sites such as Er and P. Er in Si is interesting due to the particularly low optical losses at 1550 nm which allows the Er to be incorporated into high-Q Si optical resonators. Finally, Er in Si is important due to the applications in Si compatible opto-electronics for telecommunication and high-speed interconnects.

Particular applications include:
optical addressing of a single dopant atom/ion with charge detection readout:
detection of the photoionization of a single Er atom by means of charge detection:
(single-shot) optical detection of the electronic and nuclear spin state of a single dopant by means of charge sensing:
detection of mid-gap state excitation by charge readout; and
control the state of the atom/ion by means of a local electric field and thus the transition frequency.

Optical addressing of individual provide for the investigation of Er in silicon. As a promising approach to Si-photonics, Si:Er combines the successful Si technology and the $^4I_{15/2}$-$^4I_{13/2}$ direct transition of Er, which coincides with the 1.5 μm optical transmission window of silica optical fibres. The inner shell (4f$^{11}$) of the Er$^{3+}$ ion is shielded from its surroundings by completely filled outer shells (5s$^2$ and 5p$^6$), so the 4f-transitions have smaller linewidth than the inter-shell transitions [18] leading to higher addressability. Consequently, optical access to individual Er atoms provides a path to study the physics of Si—Er interaction on a single-site level. Moreover, optical access to the nuclear spin states of individual atoms in a semiconductor will extend the knowledge of hyperfine interaction and coupling between atoms in a semiconductor. In particular, the realisation with Er in silicon is useful to both quantum computation and communication, as a multilevel qubit can be developed with the large nuclear spin I=7/2 of $^{167}$Er. Optical addressing of individual atoms in a semiconductor will also boost the microstructural study to a single-site level, including microscopic aspects, electrical and optical activity, etc.

BRIEF DESCRIPTION OF THE DRAWINGS

The best mode will now be described with reference to the following drawings, in which:

FIG. 1(a) is a scanning electron micrograph of a SET device and a band structure of erbium in silicon.

FIG. 1(aii) is a diagram showing the tunnelling current enhanced when the atom is ionized under resonant illumination.

FIG. 1(b) is a graph showing SET charge sensing the loss (or gain) of electron induces a transient shift of the I-$V_G$ curve towards lower (or higher) gate voltage, causing a change in current from I(q$^0$) to I(q$^+$) (or I(q$^-$)).

FIG. 1(ci) shows the current-time traces recorded with a fixed gate voltage (V$_M$) under resonant illumination.

FIG. 1(cii) shows the current-time traces recorded with a fixed gate voltage (V$_M$) under non-resonant illumination.

FIG. 1(d) is a histogram of current-time traces measured at different wavelengths, with the centre wavelength of 1537.9 nm.

BEST MODE

Figure 1:
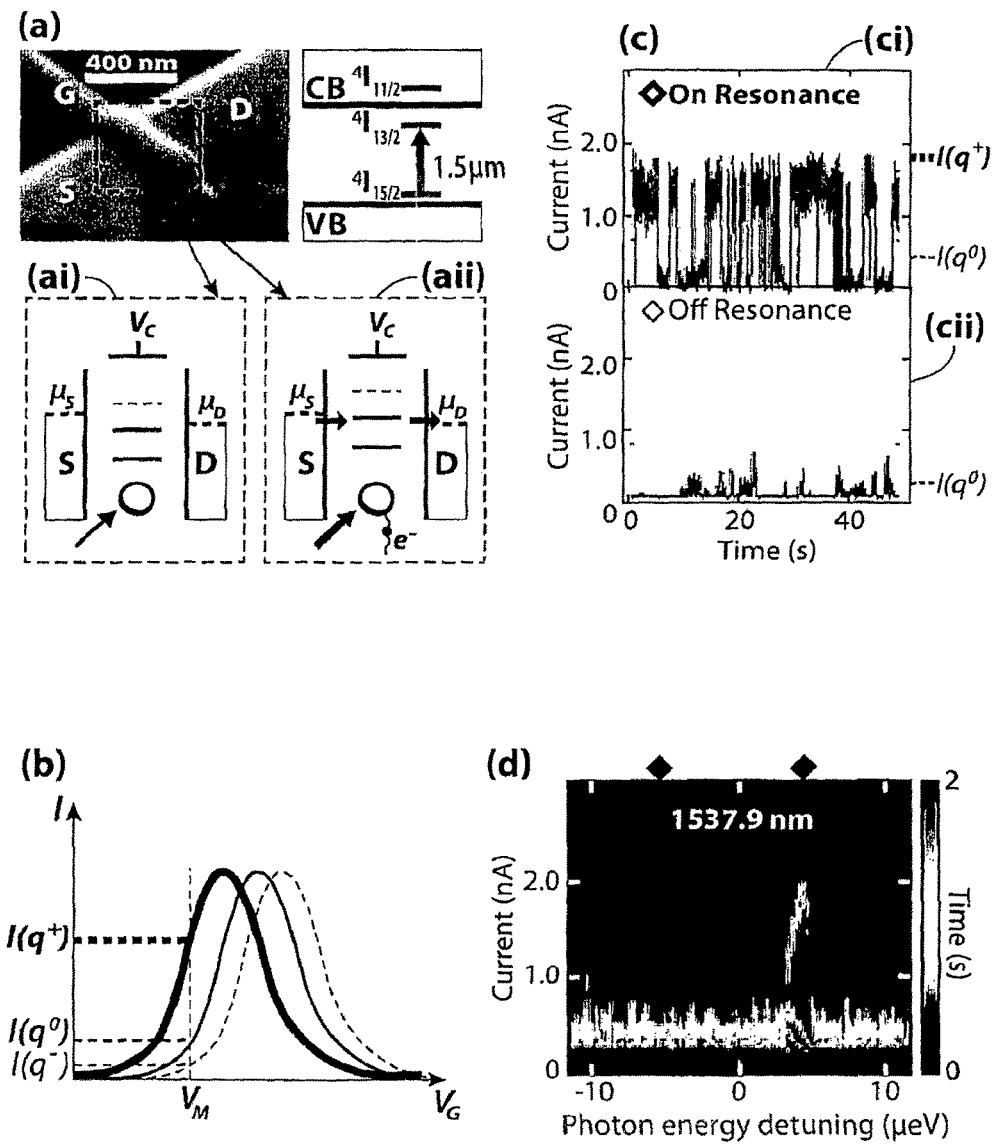
FIG. 1(ai) is a diagram showing the tunnelling current suppressed when an atom embedded in the channel is not ionized under non-resonant illumination.

The photoionization of individual Er atoms is investigated in an Er-implanted SET, which has a Si-nanowire channel wrapped with the gate, see FIG. 1(a). When a SET is biased close to the degeneracy point between two charge states (FIG. 1(a)), the transconductance can be large, as a result, a small charge displacement in the vicinity of the SET channel will lead to a significant change in tunnelling current [19]. This change in current indicates whether a site in the vicinity of the charge sensor loses or gains an electron, denoted by $q^+$ or $q^-$ see FIG. 1(b), respectively. Moreover, this change in tunnelling current depends on the capacitive coupling between the site and the SET channel, so different sites may be distinguished by the capacitive coupling.

The transition between the $^4I_{15/2}$ state and the $^4I_{13/2}$ state of an Er atom has a relatively high probability, when a laser is tuned to a resonant wavelength, and the Er atom could be further ionized due to a second-photon process or an Auger process. According to the charge sensing mechanism, the ionization of the Er atom leads to a rise in tunnelling current, and then the current will drop back due to its neutralization, contributing a two-level current-time trace, see FIG. 1(c).

In contrast, when the laser is tuned to a non-resonant wavelength, the tunnelling current mainly stays at the low level. The small fluctuation in current, which is attributed to the trap states in the insulating layer or the oxide layer with weakly capacitive coupling, could be suppressed by a proper anneal before device fabrication. It is worth noting that the two-level trace FIG. 1(c) suggests only one individual Er atom is ionized. Multiple atoms with different capacitive coupling will lead to a current-time trace with more than two levels, while two atoms with the same capacitive coupling will lead to a current-time trace with three levels once they are simultaneously ionized. FIG. 1(d) shows a photoionization spectrum of an individual Er atom. The current is recorded for a certain period at a series of laser wavelengths, and then a histogram showing the distribution of current in time is plotted as a function of the photon energy detuning. For instance, the current jumps mainly around two values (1.8 nA and 0.4 nA) at the photon energy detuning of 4 μeV, while the current stays mainly at about 0.4 nA at the photon energy detuning of −5 μeV. Both of them are consistent with the raw data as shown in FIG. 1(c). Resonances are observed via the photoionsiation spectroscopy mostly between 1535 nm and 1539 nm, which is consistent with the $^4I_{15/2}$-$^4I_{13/2}$ transition of Er, and the Er-implanted bulk silicon also verifies that by showing strong emission bands in the same wavelength range.

Figure 2:
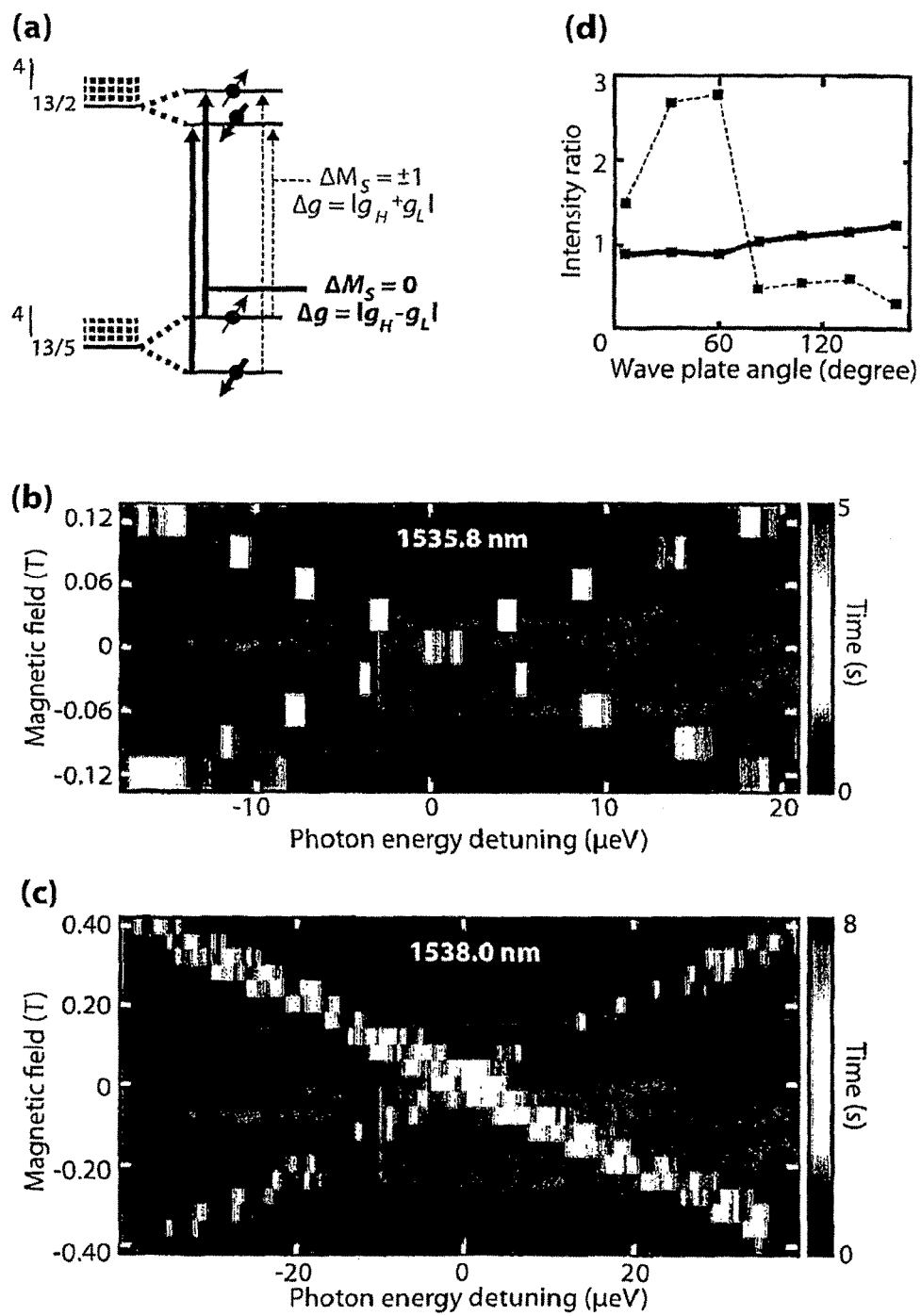
FIG. 2(a) is a schematic diagram showing the Zeeman splitting and optical transitions of Er atoms in silicon.
FIG. 2(b) is a pixel diagram showing the Zeeman splitting scan of one erbium atom with the centre wavelength of 1535.8 nm. Each pixel stands for a current-time trace recorded for 50 s, and the colour represents the time in which the current exceeds a threshold.
FIG. 2(c) is a pixel diagram showing the Zeeman splitting scan of erbium atoms with the centre wavelength of 1538.0 nm.
FIG. 2(d) is a graph showing the polarization dependence of the Zeeman splitting in FIG. 2(b) (dot) and FIG. 2(c) (square).
Figure 4:
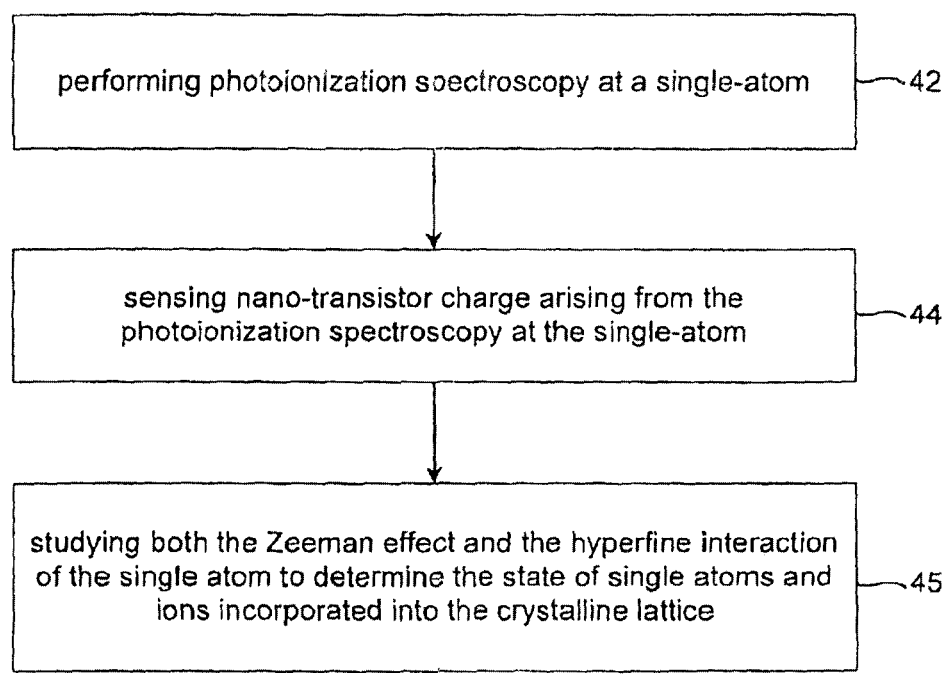
FIG. 4 shows a method for optically investigating individual nuclear spin states of single atoms incorporated into a crystalline lattice.

The Zeeman effect of individual Er atoms is demonstrated using photoionization spectroscopy (step 42, FIG. 42). FIG. 2(a) shows a schematic diagram of the Zeeman splitting and optical transitions of an Er atom in silicon (step 44, FIG. 4). Er atoms tend to take 3+ valence characteristic of the Si lattice, so the 4f electrons of an $Er^{3+}$ ion have the ground state of $^4I_{15/2}$ and the first excited state of $^4I_{13/2}$. The degeneracy of each state is lifted by the crystal field into several levels depending on the symmetry of the Er site[16]. The transition between the lowest level of $^4I_{15/2}$ and the lowest level of $^4I_{13/2}$ is responsible for the strong emission band around 1.54 μm, and the Zeeman splitting (step 46, FIG. 4) of those two levels in the case of double degeneracy is shown in FIG. 2(a). The doublet states can be described by an effective spin S=1/2, and the Zeeman interaction has the form:

$$H=\beta_e B \cdot g \cdot S,$$

Where:
$\beta_e$ is the electronic Bohr magneton,
B is the magnetic filed, and
g is the g-factor matrix[20].

Consequently, the Zeeman splitting energy of the higher (lower) energy doublet is proportional to $g_H$ ($g_L$). As shown in FIG. 2(a), the energy difference between the two $\Delta M_S=\pm 1$ ($\Delta M_S=0$) transitions can be described by $\Delta E=\beta_e \Delta g \beta$, where $\Delta g$ is the g-factor difference.

FIG. 2(b) shows the Zeeman splitting of the resonance around 1535.8 nm. When an Er atom is ionized, the current will exceed a certain threshold, which is determined by the background current fluctuation at the non-resonant region. For each current-time trace, the time, during which the current exceeds the threshold, is calculated and plotted as a function of the photon energy detuning and the magnetic field. As shown in FIG. 2(b), the resonant peak shows up at the photon energy detuning of 1 μeV at zero magnetic field, and starts to split into two diagonal arms with increasing magnetic field. It is due to the Zeeman effect of one individual Er atom, with $\Delta g \sim 4.8$. Similarly, the Zeeman splitting of the resonances around 1538.0 nm is studied as shown in FIG. 2(c), and the rectangular regions denoted by the darkest blue colour are not scanned. There appear to be two resonances with similar resonant wavelengths and the same g-factor difference ($\Delta g \sim 3.3$), which could be due to two individual Er atoms with the same site symmetry. FIG. 2(d) shows the polarization dependence of the Zeeman splitting, by scanning the two Zeeman splitting arms over the same wavelength range at both positive and negative magnetic fields. The ratio of the signal at positive magnetic field to that at negative magnetic field is plotted as a function of the rotation angle of a half-wave plate, which modifies the polarization of the light entering the cryostat. For the resonance around 1538.0 nm, see FIG. 2(c), the signal ratio differs from 2.7 to 0.3, indicating, that it's sensitive to circular polarization. For the resonance around 1535.8 nm, see FIG. 2(b), the signal ratio stays around 1, indicating that it's insensitive to circular polarization.

Figure 3:
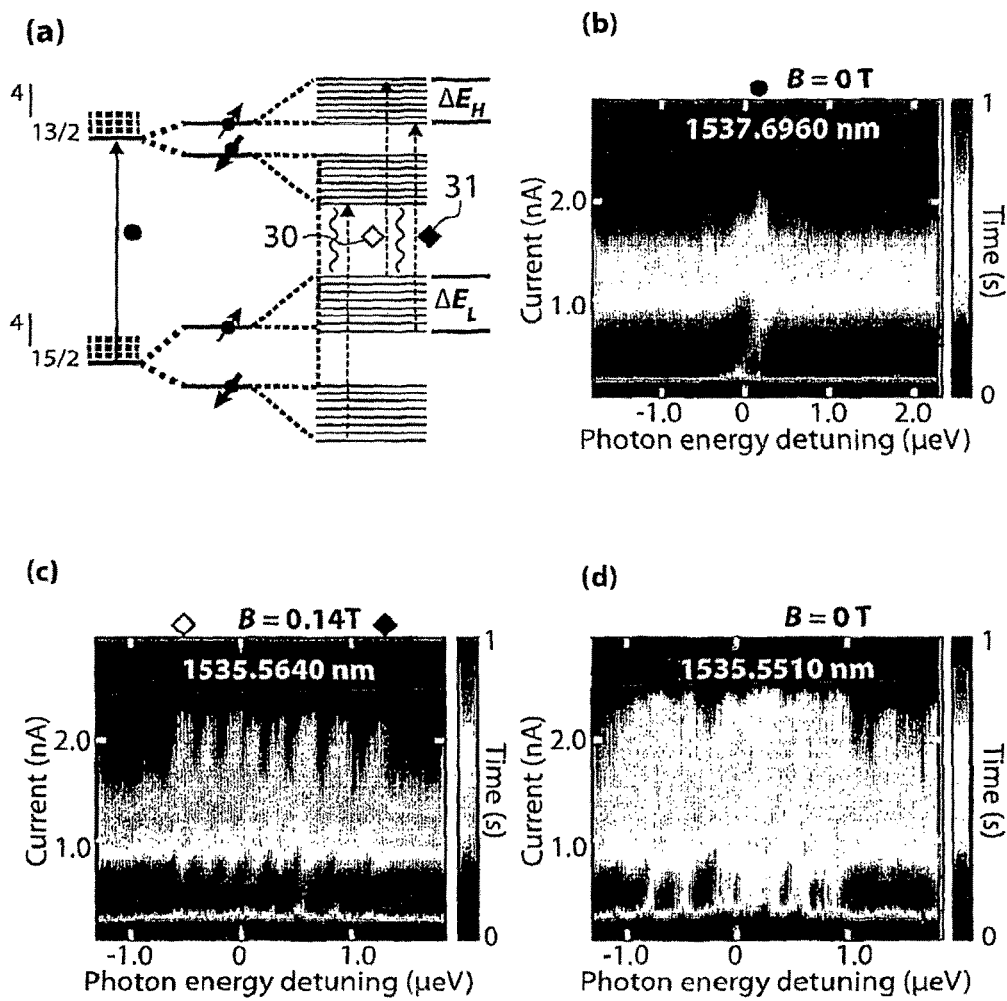
FIG. 3(a) is a schematic diagram showing the hyperfine splitting and the $\Delta M_S$=±1 transitions (dashed line) of $^{167}$Er atoms at high magnetic field. The optical transition of Er atoms with zero nuclear spin at zero magnetic field is also shown for comparison (solid line).
FIG. 3(b) is a histogram showing the photoionization spectrum of an Er atom with zero nuclear spin for comparison, with the centre wavelength of 1537.6960 nm (B=0 T).
FIG. 3(c), is a histogram showing the photoionization spectrum of an $^{167}$Er atom with the centre wavelength of 1535.5640 nm (B=0.14 T). Eight significant peaks correspond to the eight nuclear spin states of $^{167}$Er.
FIG. 3(d) is a histogram showing the photoionization spectrum of the $^{167}$Er atom with the centre wavelength of 1535.5510 nm (B=0 T). The complicated splitting is due to the crossing over of hyperfine sublevels at low magnetic field.

The hyperfine structure is of great interest as the nuclear spin has relatively long coherence times for quantum information storage [14, 21]. In addition, it is strong evidence for distinguishing between different atoms as well as defects. Erbium has six stable isotopes, among which only $^{167}Er$ (natural abundance 23%) has a nonzero nuclear spin I=7/2, leading to eight nuclear spin states. At high magnetic field, the hyperfine interaction can be treated as a perturbation of the Zeeman effect [22], so each electron spin state will split into eight sublevels due to the hyperfine interaction FIG. 3(a). At low magnetic field, the hyperfine interaction is comparable to the Zeeman effect, so the sublevels will cross over [23].

In order to investigate the hyperfine structure (step 44, FIG. 4), we use a Pound-Drever-Hall locked laser with a narrow linewidth and high stability. FIG. 3(b) shows the photoionization spectrum of an individual Er atom with zero nuclear spin, and the current is recorded for 30 s at each wavelength. The shape of the resonant peak is clearly asymmetric. Considering the charge-sensing scheme of the SET, it is probably due to the correlation between the Stark shift of the resonance and the shift of the I-$V_G$ curve, both of which are induced by the charge fluctuation in the vicinity of the SET channel. As a result, the intrinsic homogeneous linewidth of the Er resonance should be even smaller than 0.2 μeV, which appears in the photoionization spectrum. The $^{29}Si$ nuclei in the Si host lead to a broadening of the Er resonance through the magnetic dipole interactions, and the estimated linewidth is about 50 neV.

The hyperfine structure of one $^{167}Er$ atom is shown in FIG. 3(c), the photoionization spectrum taken at high magnetic field (B=0.14 T), reveals eight resonant peaks with the photon energy difference of 0.2 μeV between each other. As shown in FIG. 3(d), the photoionization spectrum taken at zero magnetic field, shows complicated splitting with 6-7 resonant peaks. The photoionization spectra of this $^{167}$Er atom are measured at a series of magnetic fields. At high magnetic field, eight significant peaks are observed all through (0.08≤B≤0.14 T), as the hyperfine interaction can be treated as a perturbation of the Zeeman effect. At low magnetic field, multiple resonances show up (−0.04 T≤B≤0.06 T), revealing the crossing over of the hyperfine sublevels on the two Zeeman splitting arms, since the hyperfine interaction is comparable to the Zeeman effect. The electron paramagnetic resonance measurements of $^{167}$Er$^{3+}$ ions in crystals show a splitting energy ($2\Delta E_L$) of about 30 µeV$^{24,25}$, which corresponds to the $\Delta M_S = \pm 1$ transitions. As shown in FIG. 3(c), the energy difference between the two most distant hyperfine peaks is only about 1.7 µeV, which is much smaller than the typical splitting energy of the $\Delta M_S = \pm 1$ transitions. Accordingly, the two most distant hyperfine peaks correspond to the two $\Delta M_S = 0$ transitions indicated by the two diamonds 30 and 31 in FIG. 3(a), and the splitting energy is $|\Delta E_H - \Delta E_L| = 1.7$ µeV. The eight significant peaks, representing the eight different nuclear spin states of $^{167}$Er, demonstrate that the resonances are due to the $^{167}$Er atom rather than other atoms or defects.

In conclusion, individual Er atoms and individual nuclear spin states of one $^{167}$Er atom in natural silicon were addressed with high resolution and sensitivity via charge sensing photoionization spectroscopy. Individual Er atoms are spectrally distinguished showing a linewidth smaller than 0.2 µeV, and the Zeeman splitting of individual Er atoms is also studied with high resolution. In contrast, the smallest width of Er spectral lines observed in silicon was about 8 µeV [17], while the Zeeman splitting was only observed in a few sites of Er in silicon [26]. The site-symmetry of individual Er atoms can be determined with the polarization dependence and a rotating magnetic field measurement. For the first time, the hyperfine structure of one $^{167}$Er atom in silicon is clearly shown, and single ionization events of individual Er atoms are observed in real time. At high magnetic field, the observation of eight significant resonant peaks demonstrate that it is due to the hyperfine interaction of $^{167}$Er, enabling the addressing of individual nuclear spin states at 4.2 K. In addition, the charge sensing technique provides with the applicability at even higher temperature than 4.2 K, as well as the freedom of magnetic field, since the readout scheme does not require the specific magnetic field in contrast to the molecular spin transistor [27]. Such results are important for single-shot readout and accurate manipulation of electron spin states and nuclear spin states of individual atoms in semiconductor, including intensively studied P atoms in silicon. The high addressability will allow the optical control over nearby atoms inside a low-loss cavity and distant atoms linked by a waveguide, so that large arrays of photon-coupled qubits may be routed on-chip. A further study of photoionization mechanism, and a resonant second-photon process, would help to improve readout fidelity.

The devices are fabricated using the techniques described by reference [28], After fabrication, an Er:O co-implantation (dose ratio 1:6) is performed with the implantation energy of 400 keV and 55 keV, respectively, so that most of the atoms will end up in the channel region of the device. Then the devices are annealed at 700° C. in N$_2$ to remove the implantation damage and to initiate the formation of Er centres and Er—O complexes. The current is carried by the corners of the nanowire channel due to the corner effect [28], and thus the charge sensor is mainly sensitive to the channel-corner region (100×50×50 nm), in which there should be approximately 50 Er atoms based on the simulation.

All the experiments are carried out in a liquid helium cryostat at 4.2 K. The laser beam, with 4-5 mW optical power, goes through a single-mode fibre and irradiates on the sample with a diameter of about 1 mm. In the initial phase of the experiments (FIGS. 1 and 2), a commercial tunable laser with an external cavity is used. To keep a high precision, one centre wavelength is set by the motor actuator, drive the piezo-actuator to sweep the wavelength around the centre wavelength, and then sweep the wavelength around the next centre wavelength with an overlap. Contiguous sweeps are combined according to the resonance showing up on both sweeps, otherwise With the specified overlap.

In the hyperfine structure experiments (FIG. 3), the Pound-Drever-Hall technique is used to stabilise the wavelength of another laser to about 0.01 pm, and a wavelength meter is used to compensate the thermal drift. The wavelength scan is precisely controlled with an electro-optic modulator by tuning the microwave frequency.

INDUSTRIAL APPLICATION

There are many applications for this techniques, including in the areas of quantum information, single site spectroscopy and single site metrology.

Single Site Spectroscopy
Although much progress has been made in the last few decades, efficient optical emission from Si [16,17]. By enabling single site spectroscopy the technique presented here can be used to investigate and hence help enable the optimisation of the emission properties of emitters, such as erbium, in silicon. Similarly the technique could be used to study other emitters in other substrates.

Spectroscopic technique to determine the structure and dynamics of single impurities sites.

Single Site Metrology
The techniques presented here can be used to study the properties of the environment surrounding single target centres in solids. The technique enables extremely high spatial resolution studies to be conducted. For example the technique could be used to study the structure and dynamical properties inside the channel in a nano MOSFET.

Spectroscopic technique to determine the structure and dynamical properties of a channel in a nano MOSFET.

Optical access to individual dopant atoms/ions in a Si nano MOSFET.

Quantum Information Applications:
Distant entanglement, high fidelity, and long coherence times, have been demonstrated with single trapped atomic ions [1-4] and a nitrogen-vacancy centre in diamond [5-6]. Optical addressing of single particles is potentially important for both quantum computation and communications [7-10]. Developments in Si:P fabrication and engineering have made it possible to realise single-atom transistors with atomic precision [11], and a single-atom electron spin qubit [12]. Optical addressing of an atom in silicon is appealing since large arrays of qubits may be assembled using silicon integrated circuit technology. So far such an array has only been achieved with P ensembles in highly purified $^{28}$Si [13,14]. Long coherence times of electron spins [13] and nuclear spins [14] have been demonstrated with bound exciton transitions, but low efficiency prohibits single-spin measurement and quantum information transfer through photons. The non-invasive sensing of charge displacements, via either a quantum point contact or a single electron transistor (SET), has been developed to directly probe single electron charges, and to indirectly probe single spins in nanostructures [15].

Applications Relevant to Quantum Information Science Include:
Optical addressing of (single) quantum states combined with electrical readout.
Multiple optical centres can be addressed within the one readout unit.
Readout and control of sublevels of dopant atoms/ions (diagram 1) [Optical initialization, manipulation, and readout of the electron and nuclear spin of an impurity in a Si.]
Possible candidates: shallow dopants based on excitonic transitions and direct transitions based on transition metal ions and rare earth ions, including Pr and Er, in semiconductors and dielectrics (diagram 2).
An optical solid-state quantum interface based, e.g., on quantum bits in Si. This is realized by the combination of charge sensing with compact optics including waveguides and optical resonators to achieve strong light matter interaction. This interface enables quantum information transport, i.e. non local (compact optics on chip to km via fibre) interaction between qubits, e.g. quantum information transport in Si via optical coupling including single-shot readout of nuclear and electrical states. Such an interface enables in general, optical single-shot readout of the electron and nuclear spin of an impurity in a semiconductor.
Applications Specific to Er:Si:
15/2 electron state, 7/2 nuclear state→readout of all these sub levels
Two qubit gates via Er excited states
Quantum control of the electron and nuclear states (RF and optical excitation)
Hybrid Er/P:Si qubit
Detection of two photon resonant ionization of a single site
Other Applications
An optical interface to impurity based quantum bits in Si.
Quantum information transport in Si via optical coupling.
Optical initialization, manipulation, and readout of the electron and nuclear spin of an impurity in a Si.
(Optical) single-shot readout of the electron and nuclear spin of an impurity in a semiconductor.
Spectroscopic technique to determine the structure and dynamics of single impurities sites.
Optical access to individual dopant atoms/ions in a Si nano MOSFET.
Spectroscopic technique to determine the structure and dynamical properties of a channel in a nano MOSFET.
Detection of two photon resonant ionization of a single site.
Sensing Applications
The potential narrow line width of an atomic transition in conjunction with the high fidelity of charge detection can be utilised for sensing applications. This holds for all the different impurities and semiconductors mentioned before. Electrical fields can be detected which high resolution due to the the Stark shift of the atomic transition. The same holds for magnetic field due to the Zeeman shift of the atomic lines. Again, this holds for all specimens mentioned but the rare earth impurities are very advantages due to the large Lande g-factor and the large moments. Finally, the atom in a semiconductor device can sense the strain, electric field, magnetic field due to shift of the atomic lines which allows mapping of the local environment of e.g. a nano-transistor.

Although the invention has been described with reference to numerous examples, it will be appreciated by those skilled in the relevant arts that many further variations and modifications will fall within the scope of the accompanying claims, and that many further applications may be found.

REFERENCES

The following documents are incorporated herein by reference:
1. Blatt, R. & Wineland, D. Entangled states of trapped atomic ions. Nature 453, 1008-1015 (2008). URL http://www.nature.com/doifinder/10.1038/nature07125.
2. Ritter, S. et al. An elementary quantum network of single atoms in optical cavities. Nature 484, 195-200 (2012). URL http://www.nature.com/doifinder/10.1038/nature11023.
3. Hofmann, J. et al. Heralded entanglement between widely separated atoms. Science 337, 72-75 (2012). URL http://www.sciencemag.org/cgi/doi/10.1126/science.1221856.
4. Stute, A. et al. Tunable ion-photon entanglement in an optical cavity. Nature 485, 482-485 (2012). URL http://dx.doi.org/10.1038/nature11120.
5. Togan, E., Chu, Y., Imamoglu, A. & Lukin, M. D. Laser cooling and real-time measurement of the nuclear spin environment of a solid-state qubit. Nature 478, 497501 (2011). URL http://www.nature.com/nature/journal/v478/n7370/abs/nature10528.html.
6. Togan, E. et al. Quantum entanglement between an optical photon and a solid-state spin qubit. Nature 466, 730-734 (2010). URL http://www.nature.com/doifinder/10.1038/nature09256.
7. Morton, J. J. L., McCamey, D. R., Eriksson, M. A. & Lyon, S. A. Embracing the quantum limit in silicon computing. Nature 479, 345353 (2011). URL http://www.nature.com/nature/journal/v479/n7373/abs/nature10681.html.
8. Ladd, T. D. et al. Quantum computers. Nature 464, 45-53 (2010). URL http://www.nature.com/doifinder/10.1038/nature08812.
9. O'Brien, J. L., Furusawa, A. & Vukovi, J. Photonic quantum technologies. Nature Photonics 3, 687-695 (2009). URL http://www.nature.com/doifinder/10.1038/nphoton.2009.229.
10. Gisin, N. & Thew, R. Quantum communication. Nature Photonics 1, 165171 (2007). URL http://www.nature.com/nphoton/journal/v1/n3/abs/nphoton.2007.22.html.
11. Fuechsle, M. et al. A single-atom transistor. Nature Nanotechnology 7, 242-246 (2012). URL http://www.nature.com/doifinder/10.1038/nnano.2012.21.
12. Pla, J. J. et al. A single-atom electron spin qubit in silicon. Nature 489, 541-545 (2012). URL http://www.nature.com/doifinder/10.1038/nature11449.
13. Tyryshkin, A. M. et al. Electron spin coherence exceeding seconds in high-purity silicon. Nature Materials 11, 143-147 (2011). URL http://www.nature.com/doifinder/10.1038/nmat3182.
14. Steger, M. et al. Quantum information storage for over 180 susing donor spins in a 28Si "Semiconductor vacuum". Science 336, 1280-1283 (2012). URL http://www.sciencemag.org/cgi/doi/10.1126/science.1217635.
15. Zwanenburg, F. A. et al. Silicon quantum electronics. arXiv:1206.5202 (2012).

16. Kenyon, A. J. Erbium in silicon. Semiconductor science and technology 20, R65 (2005). URL http://iopscience.iop.org/0268-1242/20/12/R02.
17. Vinh, N. Q., Ha, N. N. & Gregorkiewicz, T. Photonic properties of er-doped crystalline silicon. Proceedings of the IEEE 97, 1269-1283 (2009). URL http://ieeexplore.ieee.org/lpdocs/epic03/wrapper.htm?arnumber=5075751.
18. Kolesov, R. et al. Optical detection of a single rare-earth ion in a crystal. Nature Communications 3, 1029 (2012). URL http://www.nature.com/doifinder/10.1038/ncomms2034.
19. Hanson, R., Petta, J. R., Tarucha, S. & Vandersypen, L. M. K. Spins in few-electron quantum dots. Reviews of Modern Physics 79, 1217-1265 (2007). URL http://link.aps.org/doi/10.1103/RevModPhys.79.1217.
20. Guillot-Nol, O. et al. Hyperfine interaction of er3+ ions in Y2SiO5: an electron paramagnetic resonance spectroscopy study. Physical Review B 74 (2006). URL http://link.aps.org/doi/10.1103/PhysRevB.74.214409.
21. Hedges, M. P., Longdell, J. J., Li, Y. & Sellars, M. J. E cient quantum memory for light. Nature 465, 1052-1056 (2010). URL http://www.nature.com/doifinder/10.1038/nature09081.
22. Smith, K. F. & Unsworth, P. J. The hyperfine structure of 167Er and magnetic moments of 143, 145Nd and 167Er by atomic beam triple magnetic resonance. Proceedings of the Physical Society 86, 1249 (1965). URL http://iopscience.iop.org/0370-1328/86/6/311.
23. McAuslan, D., Bartholomew, J., Sellars, M. & Longdell, J. Reducing decoherence in optical and spin transitions in rare-earth-metal-iondoped materials. Physical Review A 85 (2012). URL http://link.aps.org/doi/10.1103/PhysRevA.85.032339.
24. Yang, S. et al. Electron paramagnetic resonance of er[sup 3+] ions in aluminum nitride. Journal of Applied Physics 105, 023714 (2009). URL http://link.aip.org/link/JAPIAU/v105/i2/p023714/s1&Agg=doi.
25. Bertaina, S. et al. Rare-earth solid-state qubits. Nature Nanotechnology 2, 39-42 (2007). URL http://www.nature.com/doifinder/10.1038/nnano.2006.174.
26. Vinh, N., Przybyli Aska, H., Krasilnik, Z. & Gregorkiewicz, T. Optical properties of a single type of optically active center in SiSi:Er nanostructures. Physical Review B 70 (2004). URL http://link.aps.org/doi/10.1103/PhysRevB.70.115332.
27. Vincent, R., Klyatskaya, S., Ruben, M., Wernsdorfer, W. & Balestro, F. Electronic read-out of a single nuclear spin using a molecular spin transistor. Nature 488, 357-360 (2012). URL http://www.nature.com/doifinder/10.1038/nature11341.
28. Lansbergen, G. P. et al. Gate-induced quantum-confinement transition of a single dopant atom in a siliconFinFET. Nature Physics 4, 656-661 (2008). URL http://www.nature.com/.

The invention claimed is:

1. A solid state quantum device comprising:
a semiconductor substrate;
one or more waveguides integrated into the semiconductor substrate;
one or more atomic scale impurities located within a select waveguide of the one or more waveguides and being optically coupled to the select waveguide;
a laser light source coupled to the one or more waveguides so that laser light is selectively focussed on the one or more of the atomic scale impurities to cause selective photoionization of one or more of the atomic scale impurities; and
one or more charge sensors with sub-electron charge sensitivity integrated into the select waveguide and arranged to measure a charge variation in a region of the select waveguide that contains the one or more atomic scale impurities that have been photoionized;
wherein, in use, the device operates such that the laser light is turned on to cause photoionization of one or more of the atomic scale impurities, and the one or more charge sensors detect the charge variation in the region of the semiconductor substrate that contains the one or more atomic scale impurities that have been photoionized to perform optical single-shot readout of the electron and nuclear spin of the impurity.

2. The solid state quantum device according to claim 1, wherein the semiconductor substrate comprises silicon, other III/N and II/VI semiconductors, or dielectric crystals.

3. The solid state quantum device according to claim 1, wherein the one or more atomic scale impurities comprise shallow dopants including Phosphorus (P), Arsenic (As), Antimony (Sb), Bismuth (Bi), Boron (B), Indium (In) and Aluminium (Al), or optically active sites including rare earth ions.

4. The solid state quantum device according to claim 1, wherein the laser light is generated from any laser having wavelength(s) at which photoionization occurs.

5. The solid state quantum device according to claim 1, wherein the photoionization occurs via processes, including:
direct photoionization based on a single photon, whether resonant or not;
a two photon process;
a two photon process where at least one or more transitions is resonant; or,
a resonant excitonic transition that forms a metastable state which decays and leaves the one or more of the atomic scale impurities ionized.

6. The solid state quantum device according to claim 1, wherein the one or more charge sensors comprise a gate of a silicon-on-insulator Single Electron Transistor (SET), or a dielectrics metal SET.

7. The solid state quantum device according to claim 1, wherein geometry of the one or more charge sensors is:
a planar nano transistor;
an accumulation layer Field-Effect Transistor (FET);
a metal Single Electron Transistor (SET) on a dielectric;
a coulomb blockade island charge sensor;
a charge island gate; or,
a waveguide gate.

8. The solid state Quantum device according to claim 1, comprising a Si based Single Electron Transistor (SET) in form of a Fin-Shaped Field Effect Transistor (FinFET) in which optical centres are embedded.

9. The solid state quantum device according to claim 8, wherein the SET is biased such that a small current flows just below, or above, a charge degeneracy point; the solid state quantum device is illuminated with the laser light from a single mode optical fibre; and the laser light is resonant with one or more transitions of the optical centres it photoionizes, such that the laser light changes the charge state of the optical centres which is detected by an increase, or decrease, in current in case of a loss of an electron.

10. The solid, state quantum device according to claim 9, wherein the laser light is used to gain high spectroscopic resolution with access to the electron and nuclear state.

11. A method for operating a solid state quantum device, the method comprising:

coupling one or more waveguides integrated into a semiconductor substrate to one or more atomic scale impurities, the one or more atomic scale impurities being located within a select waveguide of the one or more waveguides;

causing selective photoionization of the one or more of the atomic scale impurities by coupling a laser light source to the one or more waveguides so that laser light is selectively focussed on the one or more of the atomic scale impurities;

detecting a charge variation in a region of the semiconductor substrate that contains the scale impurities that have been photoionized by using one or more charge sensors with sub-electron charge sensitivity integrated into the select waveguide and arranged to measure a charge variation in a region of the select waveguide that contains the one or more atomic scale impurities that have been photoionized to perform optical single-shot readout of the electron and nuclear spin of the one or more atomic scale impurities that have been photoionized.

* * * * *